(12) United States Patent
Nishida

(10) Patent No.: US 10,700,028 B2
(45) Date of Patent: Jun. 30, 2020

(54) VERTICAL CHIP INTERPOSER AND METHOD OF MAKING A CHIP ASSEMBLY CONTAINING THE VERTICAL CHIP INTERPOSER

(71) Applicant: SANDISK TECHNOLOGIES LLC, Plano, TX (US)

(72) Inventor: Akio Nishida, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/892,648

(22) Filed: Feb. 9, 2018

(65) Prior Publication Data
US 2019/0252361 A1 Aug. 15, 2019

(51) Int. Cl.
*H01L 23/00* (2006.01)
*H01L 25/00* (2006.01)
(Continued)

(52) U.S. Cl.
CPC .......... *H01L 24/06* (2013.01); *H01L 23/5385* (2013.01); *H01L 23/5386* (2013.01);
(Continued)

(58) Field of Classification Search
CPC ......... H01L 25/18; H01L 24/06; H01L 25/50; H01L 23/5386; H01L 23/5385;
(Continued)

(56) References Cited

U.S. PATENT DOCUMENTS 5,432,729 A * 7/1995 Carson ................ H01L 25/0657
257/673
5,915,167 A 6/1999 Leedy
(Continued)

FOREIGN PATENT DOCUMENTS

KR 2000-0008962 A 2/2000
KR 2009-0096170 A 9/2009
(Continued)

OTHER PUBLICATIONS

International Search Report and Written Opinion of the International Searching Authority for International Patent Application No. PCT/US2018/061548, dated Mar. 7, 2019, 13 pages.

*Primary Examiner* — Benjamin Tzu-Hung Liu
(74) *Attorney, Agent, or Firm* — The Marbury Law Group PLLC

(57) ABSTRACT

A multi-grooved interposer includes an interposer substrate containing multiple parallel grooves laterally extending along a first direction and laterally spaced among one another along a second direction, and multiple conductive strips. The multiple parallel grooves are recessed from front side surfaces of the multi-grooved interposer in a third direction toward a back side surface of the multi-grooved interposer. The multiple conductive strips continuously extend across recessed surfaces in the multiple parallel grooves and the front side surfaces along the second direction with an undulating surface profile to provide electrically conductive paths across the multiple parallel grooves. Each of the multiple parallel grooves is configured to receive an edge of a respective semiconductor chip.

16 Claims, 12 Drawing Sheets

(51) Int. Cl.
 *H01L 23/538* (2006.01)
 *H01L 25/18* (2006.01)
(52) U.S. Cl.
 CPC .............. *H01L 25/18* (2013.01); *H01L 25/50* (2013.01); *H01L 2224/06155* (2013.01); *H01L 2224/06181* (2013.01); *H01L 2224/08137* (2013.01); *H01L 2224/08148* (2013.01); *H01L 2224/08168* (2013.01); *H01L 2224/08238* (2013.01); *H01L 2924/1431* (2013.01); *H01L 2924/14511* (2013.01)
(58) Field of Classification Search
 CPC . H01L 2224/08137; H01L 2924/14511; H01L 2224/06181; H01L 2224/08238; H01L 2224/08168; H01L 2224/08148; H01L 2924/1431; H01L 2224/06155; H01L 24/08; H01L 24/05; H01L 24/80; H01L 2224/08237; H01L 2224/90; H01L 2224/80013; H01L 2224/80901; H01L 25/0655
 See application file for complete search history.

(56) References Cited

U.S. PATENT DOCUMENTS

| | | |
|---|---|---|
| 2003/0027437 A1 | 2/2003 | Worz |
| 2003/0081389 A1 | 5/2003 | Nair et al. |
| 2003/0134450 A1 | 7/2003 | Lee |
| 2003/0178715 A1 | 9/2003 | Sturcken et al. |
| 2004/0084771 A1 | 5/2004 | Bolken et al. |
| 2004/0219713 A1 | 11/2004 | Lee |
| 2005/0078436 A1 | 4/2005 | Sturcken et al. |
| 2006/0113653 A1 | 6/2006 | Xiaoqi et al. |
| 2006/0145350 A1 | 7/2006 | Gross |
| 2006/0186514 A1 | 8/2006 | Shim et al. |
| 2006/0220245 A1 | 10/2006 | Ho et al. |
| 2007/0007641 A1 | 1/2007 | Lee et al. |
| 2007/0040261 A1 | 2/2007 | Hetzel et al. |
| 2007/0045828 A1 | 3/2007 | Kwon et al. |
| 2007/0069390 A1 | 3/2007 | Chen et al. |
| 2007/0117317 A1 | 5/2007 | Ikeda et al. |
| 2007/0176275 A1 | 8/2007 | Singleton et al. |
| 2008/0074852 A1 | 3/2008 | Lee |
| 2008/0111225 A1 | 5/2008 | Kim et al. |
| 2008/0216685 A1 | 9/2008 | Omoto |
| 2009/0206431 A1 | 8/2009 | Bolken et al. |
| 2009/0236753 A1 | 9/2009 | Moon et al. |
| 2009/0303690 A1 | 12/2009 | Lee et al. |
| 2010/0109133 A1 | 5/2010 | Ito et al. |
| 2010/0127361 A1 | 5/2010 | Kuan et al. |
| 2010/0289133 A1 | 11/2010 | Chao et al. |
| 2010/0327419 A1 | 12/2010 | Muthukumar et al. |
| 2011/0037161 A1 | 2/2011 | Andry et al. |
| 2011/0049687 A1 | 3/2011 | Kuan et al. |
| 2011/0170266 A1* | 7/2011 | Haensch .................. B32B 37/02 361/722 |
| 2011/0180916 A1 | 7/2011 | Han |
| 2011/0260781 A1 | 10/2011 | Takeuchi et al. |
| 2011/0271523 A1 | 11/2011 | Mantz |
| 2012/0133381 A1 | 5/2012 | Bruland et al. |
| 2012/0153468 A1 | 6/2012 | Lee |
| 2012/0193790 A1 | 8/2012 | Andry et al. |
| 2012/0204073 A1 | 8/2012 | Whetsel |
| 2012/0211878 A1* | 8/2012 | Popovic .................. H01L 24/05 257/690 |
| 2012/0228767 A1 | 9/2012 | Lee et al. |
| 2013/0015578 A1 | 1/2013 | Thacker et al. |
| 2013/0075895 A1 | 3/2013 | Miura et al. |
| 2013/0122659 A1 | 5/2013 | Wu et al. |
| 2013/0127054 A1 | 5/2013 | Muthukumar et al. |
| 2013/0154074 A1 | 6/2013 | Oh |
| 2013/0234320 A1 | 9/2013 | Lu et al. |
| 2013/0257481 A1 | 10/2013 | Metsis |
| 2013/0323885 A1 | 12/2013 | Chun |
| 2014/0013174 A1 | 1/2014 | Whetsel |
| 2014/0017852 A1 | 1/2014 | Kwon et al. |
| 2014/0092576 A1 | 4/2014 | Lucero et al. |
| 2014/0181427 A1 | 6/2014 | Jayasena et al. |
| 2014/0181483 A1 | 6/2014 | O'Connor et al. |
| 2014/0273354 A1 | 9/2014 | Ramaswami et al. |
| 2014/0332956 A1 | 11/2014 | Zheng et al. |
| 2014/0335656 A1 | 11/2014 | Oh |
| 2015/0041971 A1* | 2/2015 | Lee .................. G11C 5/025 257/737 |
| 2015/0046612 A1 | 2/2015 | Gupta |
| 2015/0091131 A1 | 4/2015 | Lamorey et al. |
| 2015/0108204 A1 | 4/2015 | Zheng et al. |
| 2015/0130046 A1 | 5/2015 | Lin et al. |
| 2015/0153411 A1 | 6/2015 | Whetsel |
| 2015/0155256 A1 | 6/2015 | Lin et al. |
| 2015/0221614 A1 | 8/2015 | Sutardja |
| 2015/0243630 A1 | 8/2015 | Jann et al. |
| 2015/0245533 A1* | 8/2015 | Wright .................. H05K 7/2039 361/56 |
| 2015/0264813 A1 | 9/2015 | Zhou et al. |
| 2015/0279828 A1 | 10/2015 | Koopmans et al. |
| 2015/0360935 A1 | 12/2015 | Gabmaier |
| 2016/0064320 A1 | 3/2016 | Li et al. |
| 2016/0141270 A1 | 5/2016 | Koopmans et al. |
| 2016/0197063 A1 | 7/2016 | Lin et al. |
| 2016/0341794 A1 | 11/2016 | Whetsel |
| 2017/0023748 A1 | 1/2017 | Lucero et al. |
| 2017/0098639 A1 | 4/2017 | Jann et al. |
| 2017/0154878 A1 | 6/2017 | Kim et al. |
| 2017/0236896 A1 | 8/2017 | Lu et al. |
| 2017/0243858 A1 | 8/2017 | Chou et al. |
| 2017/0315172 A1 | 11/2017 | Whetsel |
| 2018/0040593 A1 | 2/2018 | Zhou et al. |

FOREIGN PATENT DOCUMENTS

| | | | |
|---|---|---|---|
| KR | 2017-0018301 A | | 2/2017 |
| KR | 2017-0082303 A | | 7/2017 |
| KR | 20170082303 | * | 7/2017 |

* cited by examiner

VERTICAL CHIP INTERPOSER AND METHOD OF MAKING A CHIP ASSEMBLY CONTAINING THE VERTICAL CHIP INTERPOSER

FIELD

The present disclosure relates generally to the field of semiconductor devices, and particular to chip assembly structures employing at least one vertical chip interposer and methods of manufacturing the same.

BACKGROUND

Prior art interposers include flat substrates that are interposed between bonding pads of an underlying semiconductor chip and bonding pads of an overlying semiconductor chip. Typically, the bonding pads on a top surface have a different array configuration than the bonding pads on a bottom surface in prior art interposers to accommodate differences in the size and the pitch of bonding pads between the underlying semiconductor chip and the overlying semiconductor chip. C4 bonding employing solder balls is typically employed to attach the semiconductor chips to an interposer.

SUMMARY

According to an aspect of the present disclosure, a multi-grooved interposer includes an interposer substrate containing multiple parallel grooves laterally extending along a first direction and laterally spaced among one another along a second direction, and multiple conductive strips. The multiple parallel grooves are recessed from front side surfaces of the multi-grooved interposer in a third direction toward a back side surface of the multi-grooved interposer. The multiple conductive strips continuously extend across recessed surfaces in the multiple parallel grooves and the front side surfaces along the second direction with an undulating surface profile to provide electrically conductive paths across the multiple parallel grooves. Each of the multiple parallel grooves is configured to receive an edge of a respective semiconductor chip.

According to another aspect of the present disclosure, a method of forming a chip assembly structure is provided, which comprises the steps of: providing a multi-grooved interposer including multiple parallel grooves laterally extending along a first direction and laterally spaced among one another along a second direction, wherein the multiple parallel grooves are recessed from front side surfaces of the multi-grooved interposer in a third direction toward a back side surface of the multi-grooved interposer, wherein multiple conductive strips continuously extend across recessed surfaces in the multiple parallel grooves and the front side surfaces along the second direction with an undulating surface profile to provide electrically conductive paths across the multiple parallel grooves; providing a plurality of semiconductor chips, wherein each of the plurality of semiconductor chips includes a major surface on which a respective set of conductive pads is located; and inserting each of the plurality of semiconductor chips partially into a respective one of the multiple parallel grooves, wherein each of the plurality of semiconductor chips is in electrical contact with the multiple conductive strips through physical contact between the respective set of conductive pads and respective portions of the multiple conductive strips after insertion into the respective one of the multiple parallel grooves.

DETAILED DESCRIPTION

Figure 1A:
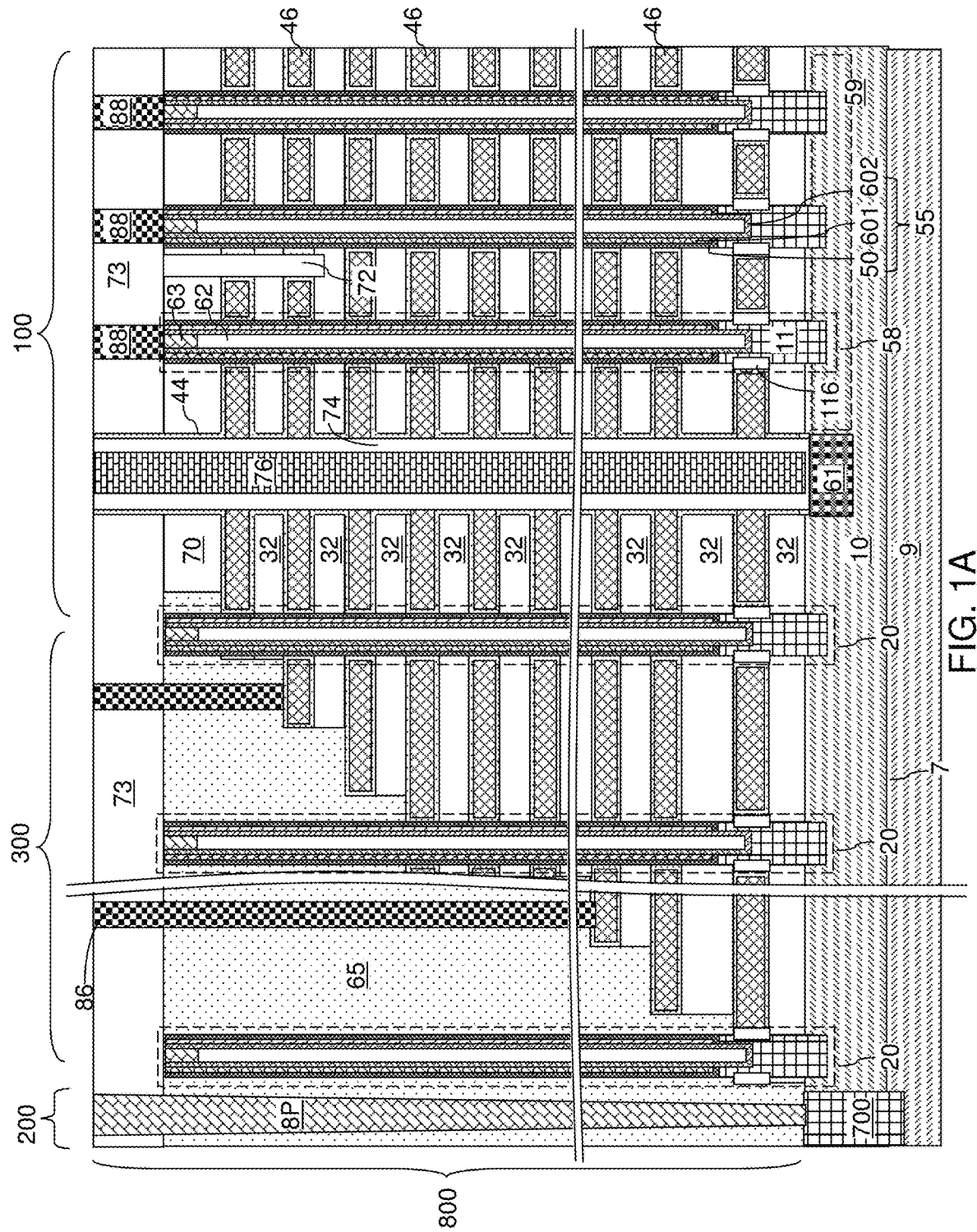
FIG. 1A is a schematic vertical cross-sectional view of an exemplary three-dimensional memory device including a three-dimensional memory array according to an embodiment of the present disclosure.

The present inventors realized that prior art interposers are constrained by a thermal budget issue to avoid melting of pre-existing bonded solder balls. Further, if the semiconductor chips are of a comparable size as the size of the interposer, up to two semiconductor chips can be bonded to the interposer. Thus, individual prior art interposers are limited in their usefulness for construction of a three-dimensional chip assembly structure. The present inventors realized that in some embodiments of the present disclosure, vertical chip interposers can reduce or overcome the above described disadvantages. A chip assembly structure can be formed by inserting edges of a plurality of semiconductor chips into a respective parallel grooves in the vertical interposer. Contact pads at the edges of the semiconductor chips are located in electrical contact with the multiple conductive strips that extend through the parallel grooves. This avoids or reduces the thermal budget limitations of prior art horizontal interposers and permits more than two chips to be attached to the same interposer with ease. In some embodiments of the present disclosure, the semiconductor chips can be three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, a "contact" between elements refer to a direct contact between elements that provides an edge or a surface shared by the elements. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the embodiments of the present disclosure can include monolithic three-dimensional NAND memory devices assembled non-monolithically into a chip assembly using a vertical interposer.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Figure 1B:
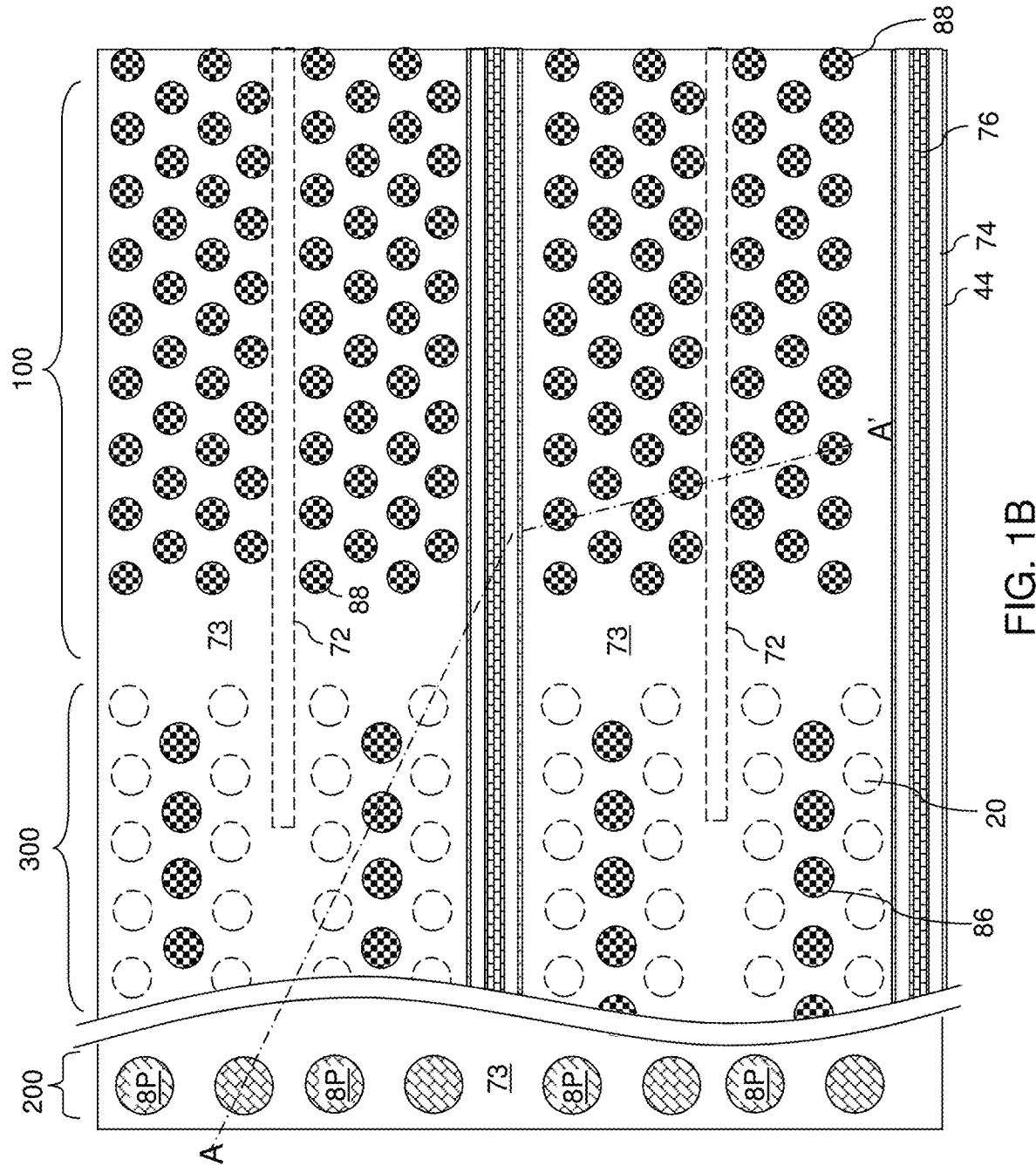
FIG. 1B is a top-down view of the exemplary three-dimensional memory device of FIG. 1A.

A non-limiting example of a three-dimensional memory device that can be included in a semiconductor die is illustrated in FIGS. 1A and 1B. While the three-dimensional memory device illustrated in FIGS. 1A and 1B include vertical NAND memory devices, the memory devices that can be employed for the semiconductor chips employed in the chip assembly structures of the present disclosure include other memory devices such as NOR memory devices, SRAM's, DRAM's, ReRAM memory devices (including phase change memory devices), spin torque memory devices, or any other memory device that can be packaged in a semiconductor chip. Further, semiconductor chips including logic devices, such as a processor chip, can be employed for the chip assembly structures of the present disclosure.

The three-dimensional memory illustrated in FIGS. 1A and 1B includes a substrate (9, 10), which can be a semiconductor substrate. The substrate (9, 10) can include a substrate semiconductor layer 9 that is provided as a semiconductor wafer, such as a silicon wafer and an optional semiconductor material layer 10 that is formed on the upper surface 7 of the substrate semiconductor layer 9. Semiconductor devices 700 such as field effect transistors (e.g., CMOS devices) can be formed on the semiconductor substrate to provide a peripheral (e.g., driver) circuit for controlling operation of the three-dimensional memory devices provided in the memory array region 100. The region of the semiconductor devices 700 is referred to as a peripheral device region 200. An alternating stack of insulating layers 32 and spacer material layers are formed over the substrate (9, 10). The spacer material layers are formed as, or are subsequently replaced with, electrically conductive layers 46, which function as word lines/control gate electrodes and select gate electrodes of the NAND memory device. An insulating cap layer 70 can be formed over the alternating stack (32, 46).

A staircase region can be formed in the contact region 300 by patterning the alternating stack (32, 46) such that underlying layers extend farther than overlying layers. A retro-stepped dielectric material portion 65 can be formed over the stepped surfaces of the alternating stack (32, 46) in the staircase region. Memory openings can be formed in the memory array region 100 and support openings can be formed in the contact region 300 by an anisotropic etch employing an etch mask layer. Memory opening fill structures 58 can be formed in each memory opening, and support pillar structures 20 can be formed in each support opening. The memory opening fill structures 58 and the support pillar structures 20 can include a same set of structural elements have a same composition. For example, each of the memory opening fill structures 58 and the support pillar structures 20 can include an optional pedestal channel portion 11, a memory stack structure 55, an optional dielectric core 62, and a drain region 63. Each memory stack structure 55 can include a memory film 50 and a semiconductor channel 60. Each memory film 50 can include a layer stack of, from outside to inside, a blocking dielectric layer, a vertical stack of memory elements (which may be embodied, for example, as portions of a charge storage material layer located at levels of the electrically conductive layers 46), and a tunneling dielectric layer. Each semiconductor channel 60 can include a first semiconductor channel layer 601 and a second semiconductor channel layer 602. Optionally, drain-select-level shallow trench isolation structures 72 can be formed through a subset of layers in an upper portion of the alternating stack (32, 46). The electrically conductive layers 46 that are cut by the select-drain-level shallow trench isolation structures 72 correspond to the drain-select gate electrodes of the NAND memory device. The drain-select-level shallow trench isolation structures 72 include a dielectric material such as silicon oxide, located in a trench.

A contact level dielectric layer 73 can be formed over the alternating stack (32, 46). If the spacer material layers are provided as sacrificial material layers, backside trenches can be formed between groups of memory opening fill structures 58 to facilitate replacement of the sacrificial material layers with electrically conductive layers 46. Backside recesses can be formed by introducing into the backside trenches an isotropic etchant that etches the material of the sacrificial material layers selective to the insulating layers 32, the memory opening fill structures 58, and the support pillar structures 20. Removal of the sacrificial material layers forms backside recesses that laterally surround the memory opening fill structures 58 and the support pillar structures 20. Tubular insulating spacers 116 can be formed around the pedestal channel portions 11, for example, by oxidation of the semiconductor material of the pedestal channel portions 11. Backside blocking dielectric layers 44 and the electrically conductive layers 46 can be formed in the backside recesses.

Source regions 61 can be formed in the semiconductor material layer 10 underneath the backside trenches, for example, by ion implantation. Surface regions of the semiconductor material layer 10 between the pedestal channel portions 11 and the source regions 61 constitute horizontal semiconductor channels 59. Insulating spacers 74 and backside contact via structures 76 can be formed in the backside trenches. Additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63 to electrically connect the drain regions 63 to overlying bit lines (not shown). Word line contact via structures 86 can be formed on the electrically conductive layers 46 through the contact level dielectric layer 73 and the retro-stepped dielectric material portion 65. Peripheral device contact via structures 8P can be formed through the contact level dielectric layer 73 and the retro-stepped dielectric material portion 65 directly on respective nodes of the peripheral devices. Additional interconnect level dielectric material layers (not shown) and additional metal interconnect structures (not shown) can be formed. The collection of all device structures and all interconnect structures on, or above. The substrate (9, 10) up to the level of the additional interconnect level dielectric material layers is herein referred to as a semiconductor device assembly 800.

It should be noted that the semiconductor device assembly 800 illustrated in FIGS. 1A and 1B is only illustrative. Any semiconductor device assembly 800 including a substrate, semiconductor device thereupon, metal interconnect structures providing electrical contact among the semiconductor devices, and interconnect level dielectric layers supporting metal interconnect structures can be employed for the purpose of implementing embodiments of the present disclosure.

Figure 2A:
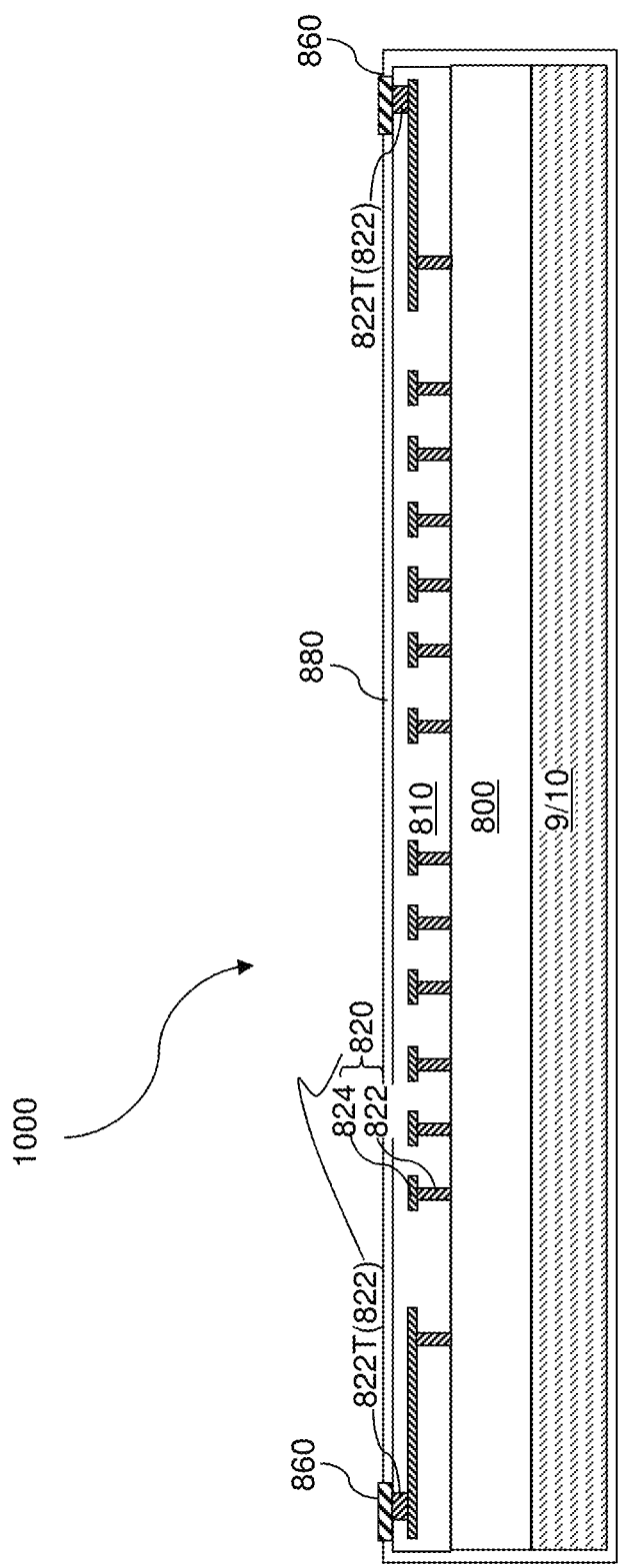
FIG. 2A is a vertical cross-sectional view of a first exemplary semiconductor chip that may incorporate the exemplary three-dimensional memory device of FIGS. 1A and 1B according to an embodiment of the present disclosure.
Figure 2B:
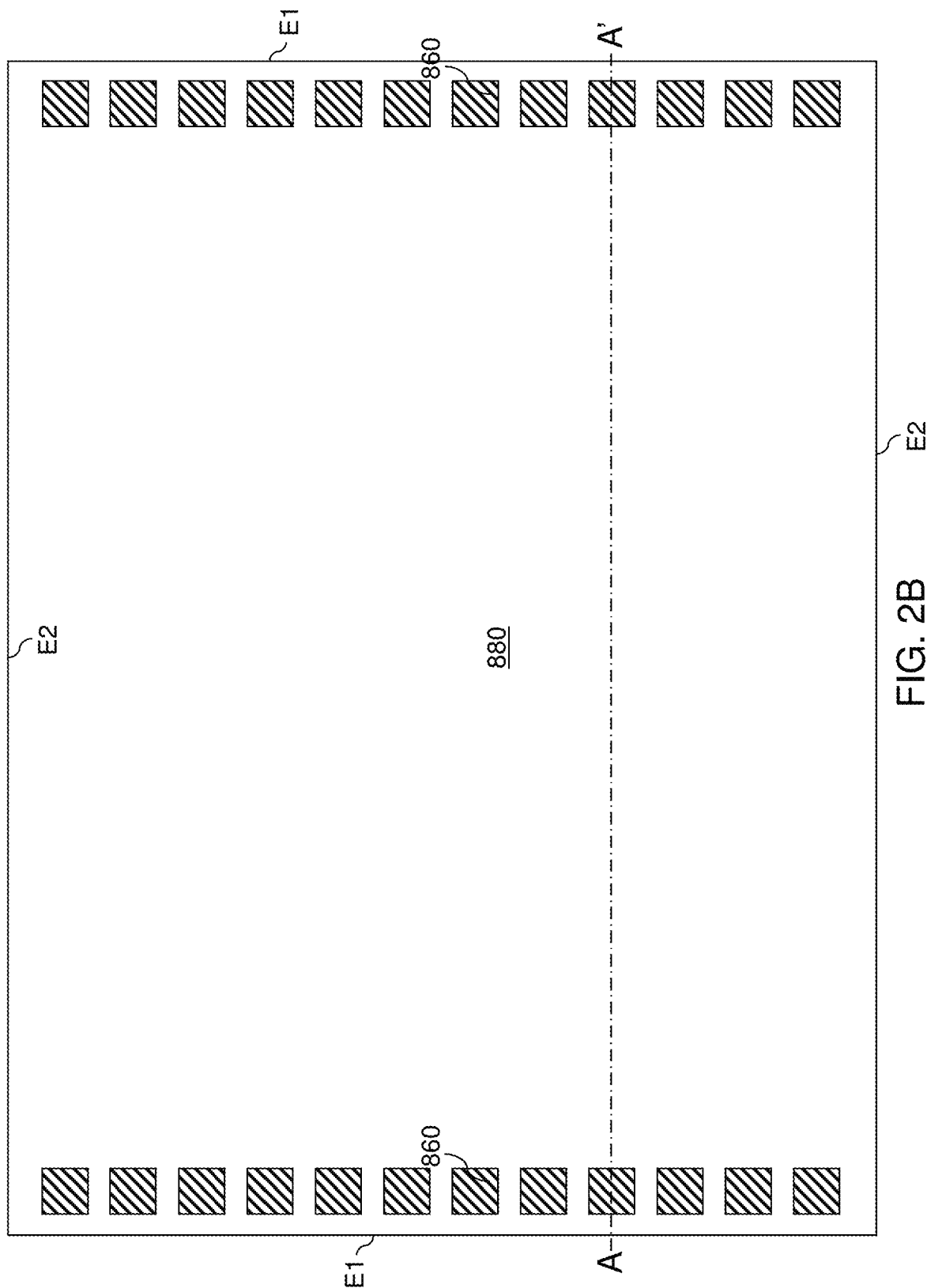
FIG. 2B is a top-down view of the first exemplary semiconductor chip of FIG. 2A.

Referring to FIGS. 2A and 2B, a semiconductor chip 1000 that can be employed to form a chip assembly structure of the present disclosure is illustrated. The semiconductor chip 1000 can be formed by employing the combination of a substrate (9, 10) and a semiconductor device assembly 800.

Input-output (I/O) level metal interconnect structures 820 can be formed over the topmost level of the metal interconnect structures within the semiconductor device assembly 800 to provide electrical contact to each input node and to each output node of the metal interconnect structures. The I/O level metal interconnect structures 820 can include I/O level metal via structures 822 and I/O level metal line structures 824. A subset of the I/O level metal via structures 822 located at the topmost level is herein referred to as topmost via structures 822T. Multiple levels of the I/O level metal via structures 822 and multiple levels of the I/O level metal line structures 824 may be employed. The I/O level metal interconnect structures 820 can be embedded in dielectric material layers, which are herein referred to as input-output (I/O) level dielectric material layers 810. The various I/O level metal interconnect structures 820 and the various I/O level dielectric material layers 810 can be formed level by level. The topmost layer among the I/O level dielectric material layers 810 can include a passivation material layer, which can be a dielectric material that blocks diffusion of contaminants and gases such as hydrogen. For example, a silicon nitride layer can be employed for the topmost layer among the I/O level dielectric material layers 810.

The general configuration of the I/O level metal interconnect structures 820 can be selected that the topmost via structures 822T among the I/O level metal via structures 822 are formed as a single row of topmost via structures 822T extending along a horizontal direction that is parallel to a top surface of the substrate (9, 10), or as two rows of topmost via structures 822T that extend along a horizontal direction and laterally spaced from each other by a uniform spacing. Each row of topmost via structures 822T can be formed proximate to the locations of an edge of a semiconductor chip 1000. Subsequently, each row of topmost via structures 822T can be contacted by a respective row of conductive pads 860. The conductive pads 860 can be formed as a single row of conductive pads 860 if the semiconductor chip 1000 includes a single row of topmost via structures 822T, or can be formed as two rows of conductive pads 860 if the semiconductor die includes two rows of topmost via structures 822T.

The substrate semiconductor layer 9 can be provided as a commercially available semiconductor wafer, such as a silicon wafer, and multiple dies for semiconductor chips 1000 can be formed on the semiconductor wafer. Typically, 50-5,000 semiconductor dies can be formed on a semiconductor wafer by forming the structures for the optional semiconductor material layer 10, the semiconductor device assembly 800, the I/O level metal interconnect structures 820, the I/O level dielectric material layers 810, and the conductive pads 860. In one embodiment, each of the multiple dies can have a rectangular shape in a plan view, i.e., in a view along a vertical direction perpendicular to the top surface of the substrate semiconductor layer 9. Upon dicing, each of the multiple dies can become a semiconductor chip 1000 illustrated in FIGS. 2A and 2B. Each of the semiconductor chips 1000 can have a rectangular shape in a plan view, which can be the same as the rectangular shape of a respective die prior to dicing.

An optional insulating encapsulation matrix 880 can be formed to encapsulate a semiconductor die after dicing. The insulating encapsulation matrix 880, if present, includes an insulating material such as epoxy or a laminated insulating material stack. Suitable polishing or etching processes can be performed to physically expose top surfaces of the conductive pads 860 after formation of the insulating encapsulation matrix 880. The insulating encapsulation matrix 880 covers the top surface, the bottom surface, and the sidewalls of a contiguous set of a substrate (9, 10), a semiconductor device assembly 800, I/O level metal interconnect structures 820, and I/O level dielectric material layers 810, and includes openings for the conductive pads 860 so that the top surfaces of the conductive pads 860 are physically exposed. The insulating encapsulation matrix 880 electrically isolates, and protects from contaminants or diffusing gases, the various material portions encapsulated therein. The insulating encapsulation matrix 880 and the structures encapsulated therein (including the conductive pads 860) constitutes a semiconductor chip 1000.

As shown in FIG. 2B, semiconductor chip 1000 according to embodiments of the present disclosure can have a rectangular top surface defined by a pair of first edges E1 having a first length and a pair of second edges E2 having a second length. The first length may be in a range from 5 mm to 200 mm, and the second length may be in a range from 5 mm to 200 mm, although lesser and greater dimensions can also be employed for each of the first length and the second length. The thickness of the semiconductor chip 1000 can be in a range from 1 mm to 10 mm, although lesser and greater thicknesses can also be employed.

The conductive pads 860 can have rectangular shapes, and can be arranged as a periodic one-dimensional array adjacent to the first edge E1, or as two periodic one-dimensional arrays adjacent to the two respective first edges E1. The conductive pads 860 can have a same rectangular shape, of which a width can be in a range from 30 microns to 3 mm along the direction of the first edges E1, and of which a length can be in a range from 30 microns to 3 mm along the direction of the second edges E2, although lesser and greater dimensions can also be employed. The pitch of each periodic one-dimensional array of conducive pads 860 can be in a range from 60 microns to 2 mm, such as from 120 microns to 1 mm, although lesser and greater pitches can also be employed. The total number of conductive pads 860 within a periodic one-dimensional array of conductive pads 860 may be in a range from 2 to 1,024, such as from 8 to 256, although lesser and greater numbers of conductive pads 860 may also be employed.

The top surfaces of the conductive pads 860 can protrude above the top surface of the insulating encapsulation matrix 880 by a protrusion height, which can be in a range from 1 micron to 200 microns, such as from 5 microns to 100 microns, although lesser and greater protrusion height can also be employed. The conductive pads 860 can include a highly conductive metal such as copper, aluminum, gold, and/or silver. The malleability of the conductive pads 860 can be controlled by alloying the metallic material in the conductive pads 860 to provide an optimal level of resistance to deformation. The conductive pads 860 can have about the same level of resistance to deformation as conductive strips to be formed on a multi-grooved interposer to be subsequently described.

According to an aspect of the present disclosure, a plurality of semiconductor chips 1000 having a same set of lateral dimensions (i.e., the length and the width) can be provided. Each of the plurality of semiconductor chips includes a major surface (such as a top surface) on which a respective set of conductive pads 860 is located. As used herein, a major surface refers to a surface having at least 50% of the area of a surface having the largest area among the surfaces of an element. Each set of conductive pads 860 can be formed as a respective one-dimensional array, and can have the same size and the same pitch along the direction of the one-dimensional array. In one embodiment, each set of conductive pads 860 can be located in a row with a same edge offset distance from an edge (such as a first edge E1) of the major surface of a respective semiconductor chip 1000. The edge offset distance can be in a range from 0 micron to 2 mm, such as from 50 microns to 500 microns, although lesser and greater offset distances can also be employed. In one embodiment, each set of conductive pads 860 of the plurality of semiconductor chips 1000 comprises, and/or consists of, a set of metal pads.

Figure 3:
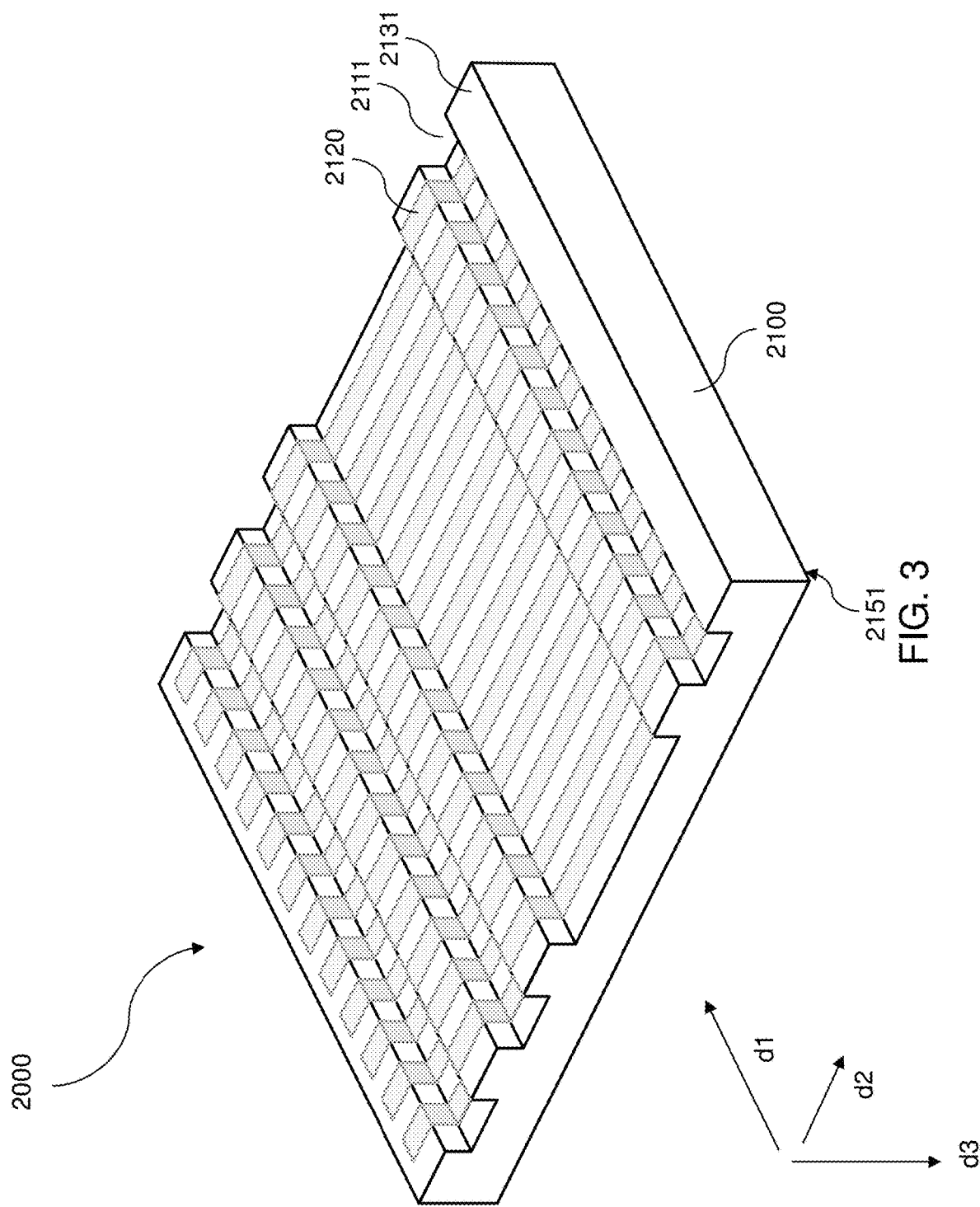
FIG. 3 is a perspective view of a first exemplary multi-grooved interposer according to an embodiment of the present disclosure.

Referring to FIG. 3, a first exemplary multi-grooved interposer 2000 according to an embodiment of the present disclosure is illustrated. The first exemplary multi-grooved interposer 2000 includes an interposer substrate 2100, which may be an insulating substrate composed of an insulating material or having a coating of an insulating material on a conductive, insulating, or semiconducting substrate. A face side of the first exemplary multi-grooved interposer 2000 includes multiple parallel grooves 2111 laterally extending along a first direction d1 and laterally spaced among one another along a second direction d2, which is perpendicular to the first direction d1. The first direction d1 and the second direction d2 can be within a plane that is generally parallel to surfaces on the face side of the first exemplary multi-grooved interposer 2000.

The multiple parallel grooves 2111 are recessed from front side surfaces 2131 of the multi-grooved interposer 2000 in a third direction d3 toward a back side surface 2151 of the multi-grooved interposer 2000. The front side surfaces 2131 comprise top surfaces of the ridges which separate adjacent grooves 2111 on the front side of the multi-grooved interposer 2000. The recess depth of the multiple parallel grooves 2111 can be in a range from the sum of the edge offset distance and 30% of the length of the conductive pads 860 along the direction of the second edges E2 to the sum of the edge offset distance and 300% of the length of the conductive pads 860 along the direction of the second edges E2. In an illustrative example, the recess depth of the multiple parallel grooves 2111 can be in a range from 100 microns to 5 mm, such as from 200 microns to 2.5 mm, although lesser and greater recess depths can also be employed.

Multiple conductive strips 2120 continuously extend across recessed surfaces in the multiple parallel grooves 2111 and across the front side surfaces 2131 along the second direction d2. Each of the conductive strips 2120 can have an undulating surface profile to provide electrically conductive paths across the multiple parallel grooves 2111. In one embodiment, each of the conductive strips 2120 can extend across each of the multiple parallel grooves 211 on the front side of the multi-grooved interposer 2000.

In one embodiment, each of the multiple conductive strips 2120 can have a respective uniform width in the first direction d1. The respective uniform width can be invariant along the second direction d2 for each of the multiple conductive strips 2120. In one embodiment, each the conductive strips 2120 can have a same width, which can be in a range from 50% to 150%, such as 100%, of the width of the conductive pads 860 along the first edges E1, i.e., the dimension of a side of a conductive pad 860 that is parallel to the first edge E1. The conductive strips 2120 can have a uniform pitch along the first direction. The pitch uniform pitch of the conductive strips 2120 can be the same as the pitch of each one-dimensional array of conductive pads 860 along the direction parallel to the first edge E1.

In one embodiment, the total number of the multiple conductive strips 2120 can be the same as, or can be greater than, the total number of conductive pads 860 within each row of conductive pads 860 in each of the semiconductor chips 1000. In one embodiment, the total number of the multiple conductive strips 2120 can be the same as the total number of conductive pads 860 within each row of conductive pads 860 in each of the semiconductor chips 1000.

For each set of multiple semiconductor chips 1000 to be electrically connected, a single multi-grooved interposer 2000 or a pair of multi-grooved interposers 2000 can be employed.

Figure 4:
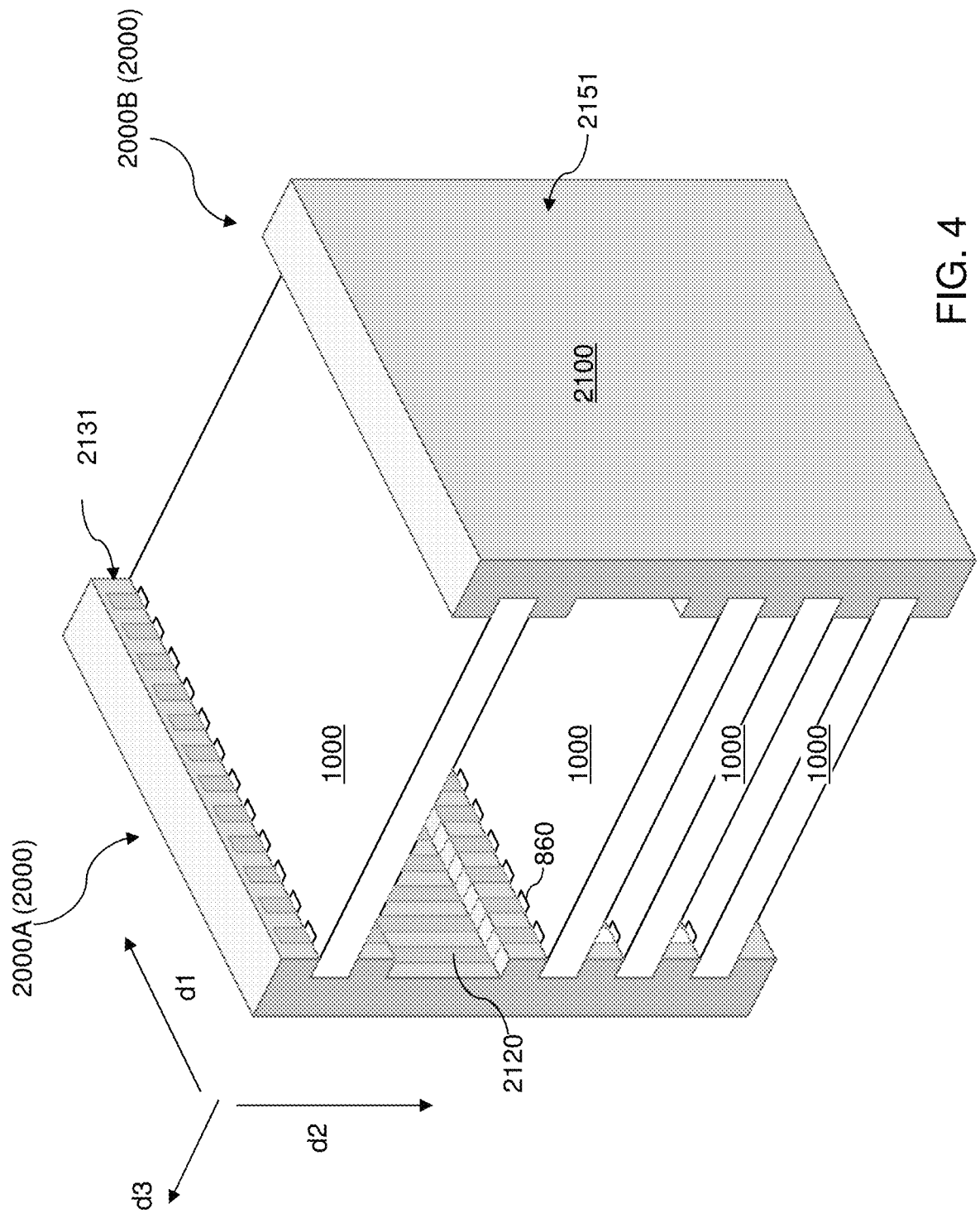
FIG. 4 is a perspective view of a first exemplary chip assembly structure according to an embodiment of the present disclosure.

Referring to FIG. 4, a first exemplary chip assembly structure according to an embodiment of the present disclosure is illustrated, which employs a pair of first exemplary multi-grooved interposers 2000 and four semiconductor chips 1000 in a non-limiting illustrative configuration. The pair of first exemplary multi-grooved interposers 2000 is herein referred to as a first multi-grooved interposer 2000A and a second multi-grooved interposer 2000B. The second multi-grooved interposer 2000B can have a mirror image configuration of the first multi-grooved interposer 2000A.

The first multi-grooved interposer 2000A includes multiple parallel grooves 2111 laterally extending along a first direction d1 and laterally spaced among one another along the second direction d2. The multiple parallel grooves 2111 can be recessed from front side surfaces of the first multi-grooved interposer 2000A in a third direction d3 toward a back side surface of the first multi-grooved interposer 2000A. Multiple conductive strips 2120 continuously extend across recessed surfaces in the multiple parallel grooves 2111 and the front side surfaces 2131 of the first multi-grooved interposer 2000A along the second direction d2 with an undulating surface profile to provide electrically conductive paths across the multiple parallel grooves 2111.

The second multi-grooved interposer 2000B includes additional multiple parallel grooves 2111 laterally extending along the first direction d1 and laterally spaced among one another along the second direction d2. The additional multiple parallel grooves 2111 are recessed from front side surfaces 2131 of the second multi-grooved interposer 2000B in an opposite direction of the third direction d3 toward a back side surface 2151 of the second multi-grooved interposer 2000B. Additional multiple conductive strips 2120 continuously extend across recessed surfaces in the additional multiple parallel grooves 2111 and the front side surfaces 2131 of the second multi-grooved interposer 2000B along the second direction d2 with an undulating surface profile to provide electrically conductive paths across the additional multiple parallel grooves 2111.

To form the first exemplary chip assembly structure, each of the plurality of semiconductor chips 1000 can be partially inserted into a respective one of the multiple parallel grooves 2111 of the first and second multi-grooved interposers (2000A, 2000B) (i.e., an edge of the each of the plurality of semiconductor chips 1000 can be partially inserted into a respective one of the multiple parallel grooves 2111). For example, each side of the plurality of semiconductor chips 1000 including a first edge E1 can be partially inserted into a respective one of the multiple parallel grooves 2111 in the first multi-grooved interposer 2000A, and each side of the plurality of semiconductor chips 1000 including another first edge E1 can be partially inserted into a respective one of the multiple parallel grooves 2111 in the second multi-grooved interposer 2000B. Each of the plurality of semiconductor chips 1000 can be in electrical contact with the multiple conductive strips 2120 of the first multi-grooved interposer 2000A through physical contact between the respective set of conductive pads 860 and respective portions of the multiple conductive strips 2120 after insertion into the respective one of the multiple parallel grooves 2111 of the first and second multi-grooved interposers (2000A, 2000B). In this case, the first multi-grooved interposer 2000A and the second multi-grooved interposer 2000B are spaced along the third direction d3 and are parallel to each other.

Generally, a plurality of semiconductor chips 1000 can be inserted partially into a respective one of the multiple parallel grooves 2111 in the first and second multi-grooved interposers (2000A, 2000B). Each of the plurality of semiconductor chips 1000 includes a major surface on which a respective set of conductive pads 860 is located. Each of the plurality of semiconductor chips 1000 is in electrical contact with the multiple conductive strips 2120 through physical contact between the respective set of conductive pads 860 and respective portions of the multiple conductive strips 2120. In one embodiment, a contact pad surface cleaning, such as an argon plasma surface cleaning may be performed before inserting an edge of each of the plurality of semiconductor chips 1000 into a respective one of the multiple parallel grooves 2111 to improve the contact. In another embodiment, the chip assembly structure can be annealed (e.g., at a temperature of 250 to 400° C.) to improve the contact after inserting the chips into the grooves.

In one embodiment, for each pair of a groove 2111 and a semiconductor chip 1000 partly inserted therein, a height of the semiconductor chip (measured along the second direction d2) can be the same as a width of the groove 2111 along the second direction d2. In one embodiment, the multiple conductive strips 2120 and each set of conductive pads 860 can have a same periodicity as the multiple conductive strips 2120 along the first direction d1.

In one embodiment, each of the first and second multi-grooved interposer (2000A, 2000B) can have a first maximum dimension along the first direction d1 in a range from 0.5 cm to 20 cm, and a second maximum dimension along the second direction in a range from 0.5 cm to 50 cm. The total number of semiconductor chips 1000 that can be inserted between the first and second multi-grooved interposers (2000A, 2000B) can be in a range from 2 to 256, such as from 2 to 64, although a greater number of semiconductor chips 2000 can be inserted between the first and second multi-grooved interposers (2000A, 2000B).

In one embodiment, the first and second multi-grooved interposers (2000A, 2000B) can have a same maximum dimension along the first direction, and have another same maximum dimension along the second direction. In one embodiment, each of the plurality of semiconductor chips 1000 can have a respective maximum lateral dimension along the first direction d1 in a range from 80% to 120%, such as 100%, of the first maximum dimension of the first and second multi-grooved interposers (2000A, 2000B). In one embodiment, the first exemplary chip assembly structure can be contained within a volume of a rectangular parallelepiped.

In one embodiment, the front side surfaces 2131 of the first and second multi-grooved interposers (2000A, 2000B) can include insulating surfaces, which may be insulating surfaces of a respective interposer substrate 2100. Each of the multiple conductive strips 2120 can comprise metal strips, and may include copper, aluminum, silver, gold, or an alloy thereof.

In one embodiment, at least two of the plurality of semiconductor chips 1000 may include a respective three-dimensional memory array, and may be configured to transmit and receive electrical signals therebetween through the multiple conductive strips 2120. Thus, the first exemplary chip assembly structure can provide stacking of multiple semiconductor memory chips.

Figure 5:
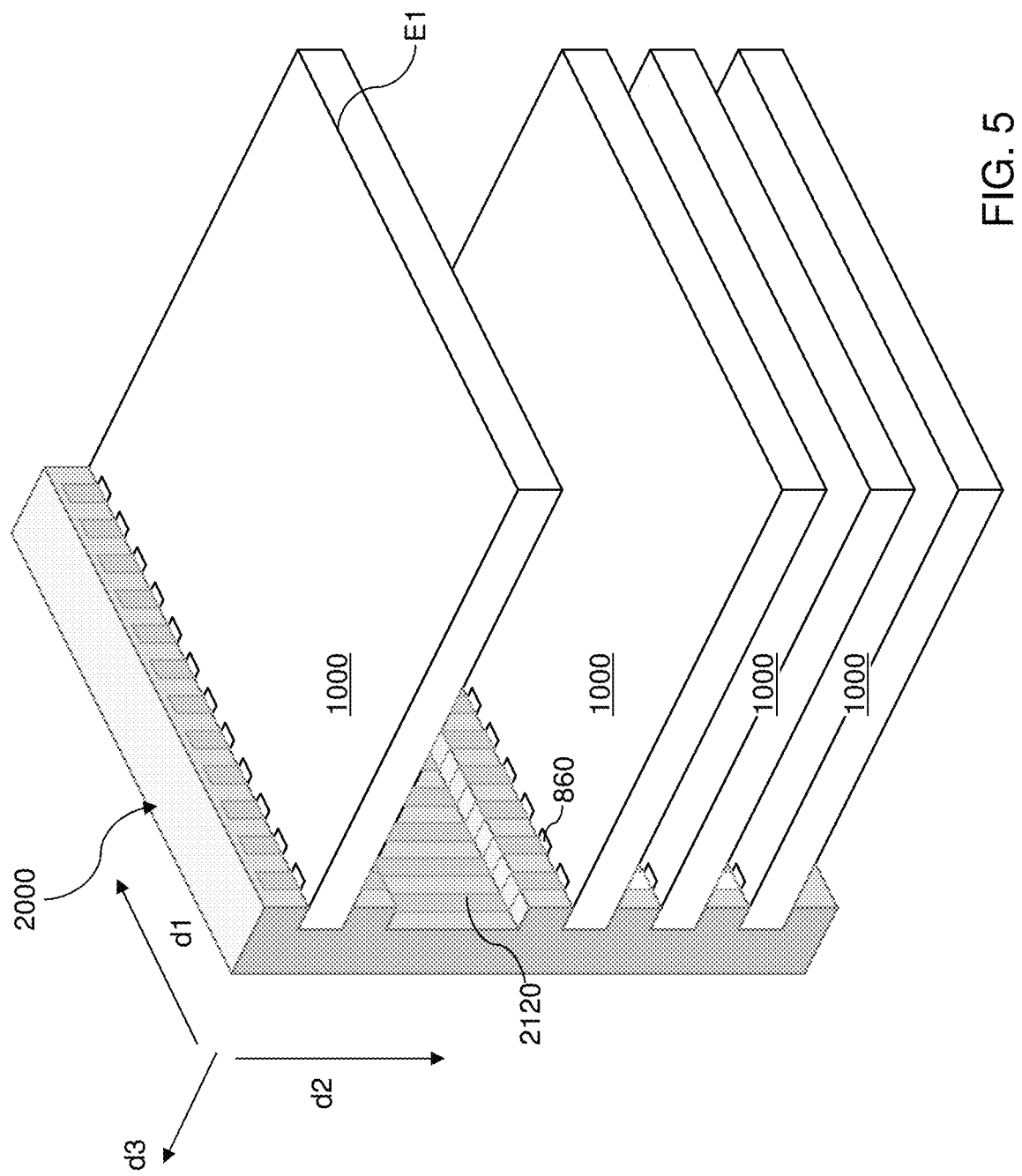
FIG. 5 is a perspective view of a second exemplary chip assembly structure according to an embodiment of the present disclosure.

Referring to FIG. 5, a second exemplary chip assembly structure according to an embodiment of the present disclosure is illustrated, which is derived from the first exemplary chip assembly structure of FIG. 4 by employing only one multi-grooved interposer 2000 in lieu of a pair of multi-grooved interposers (2000A, 2000B). In this case, each of the semiconductor chips 1000 can include only a single row of conductive pads 860 located along only one of the first edges E1. In other words, the conductive pads 860 can be formed as a single row of conductive pads 860 along one of the two first edges E1. In this case, the multiple conductive strips 2120 on the multi-grooved interposer 2000 function as signal paths among the plurality of semiconductor chips 1000. At least two of the plurality of semiconductor chips 1000 can comprise a respective three-dimensional memory array, and can be configured to transmit and receive electrical signals therebetween through the multiple conductive strips 2120.

Figure 6:
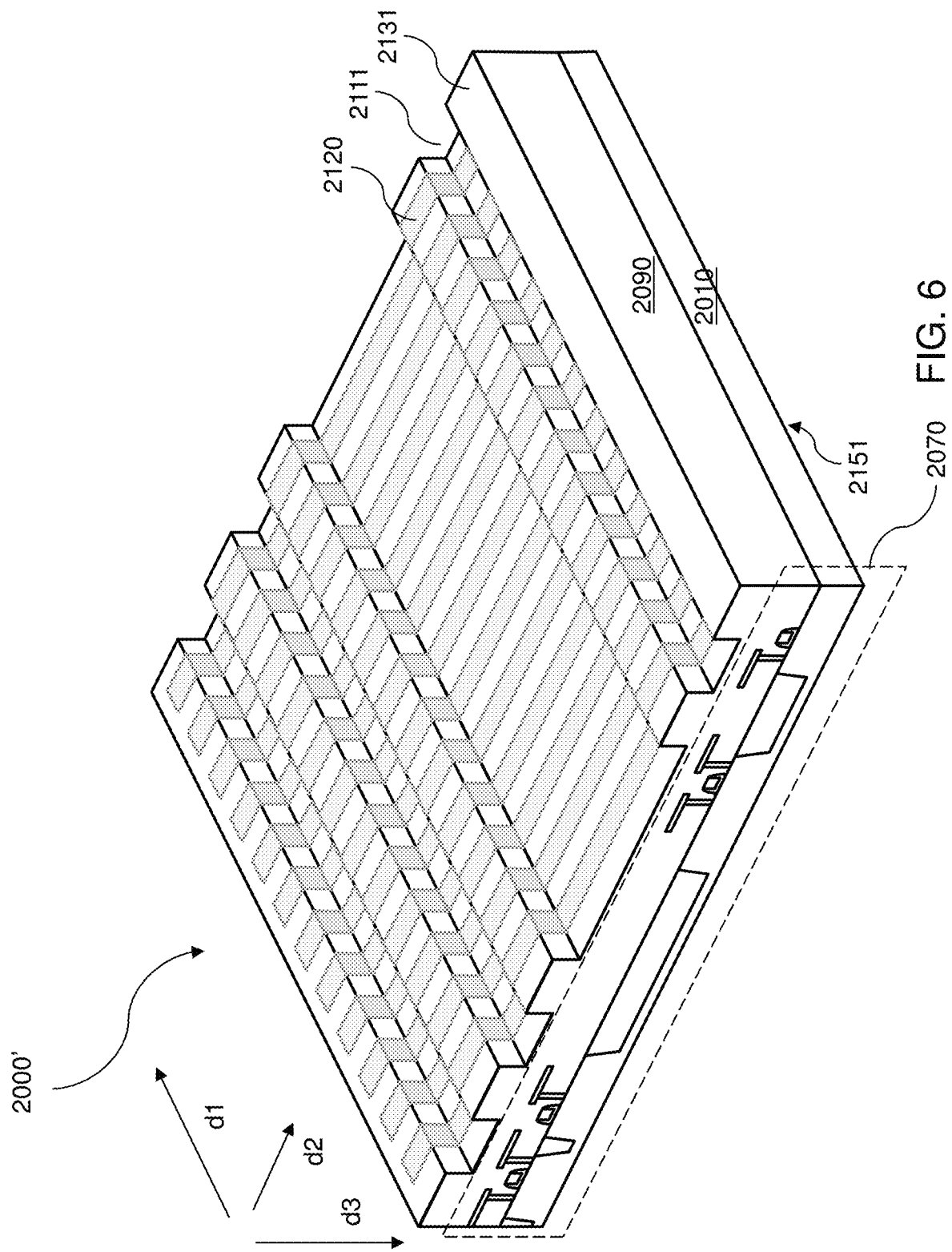
FIG. 6 is a perspective view of a second exemplary multi-grooved interposer according to an embodiment of the present disclosure.

Referring to FIG. 6, a second exemplary multi-grooved interposer 2000' according to an embodiment of the present disclosure is illustrated. The second exemplary multi-grooved interposer 2000' may be employed in lieu of each, or any, instance of the first exemplary multi-grooved interposer 2000 in the first and/or second exemplary chip assembly structure(s) described above. The second exemplary multi-grooved interposer 2000' is shown after removing a thin slice of material portions from a proximal region to show a cross-sectional view along a plane including the second direction d2 and the third direction d3.

The second exemplary multi-grooved interposer 2000' can include a semiconductor material layer provided as, or as a portion of, an interposer substrate 2100. A major surface of the semiconductor material layer can be parallel to the first direction d1 and the second direction d2, and can be perpendicular to the third direction d3. A plurality of semiconductor devices 2070 (such as field effect transistors) can be located on the major surface of the semiconductor material layer. In one embodiment, the plurality of semiconductor devices 2070 can include a peripheral circuitry that supplements, or replaces, the peripheral devices implemented as the semiconductor devices 700 in a semiconductor device assembly 800 of one or more of the plurality of semiconductor chips 1000. An insulating material layer 2090 can be located over the semiconductor devices 2070, and can support the multiple conductive strips 2120 that are located in a surface portion of the insulating material layer 2090. The semiconductor devices 2070 can be field effect transistors (e.g., CMOS devices) which are part of a peripheral (e.g., driver) circuit for controlling operation of the three-dimensional memory devices of the semiconductor device assembly 800 of one or more of the plurality of semiconductor chips 1000.

Figure 7:
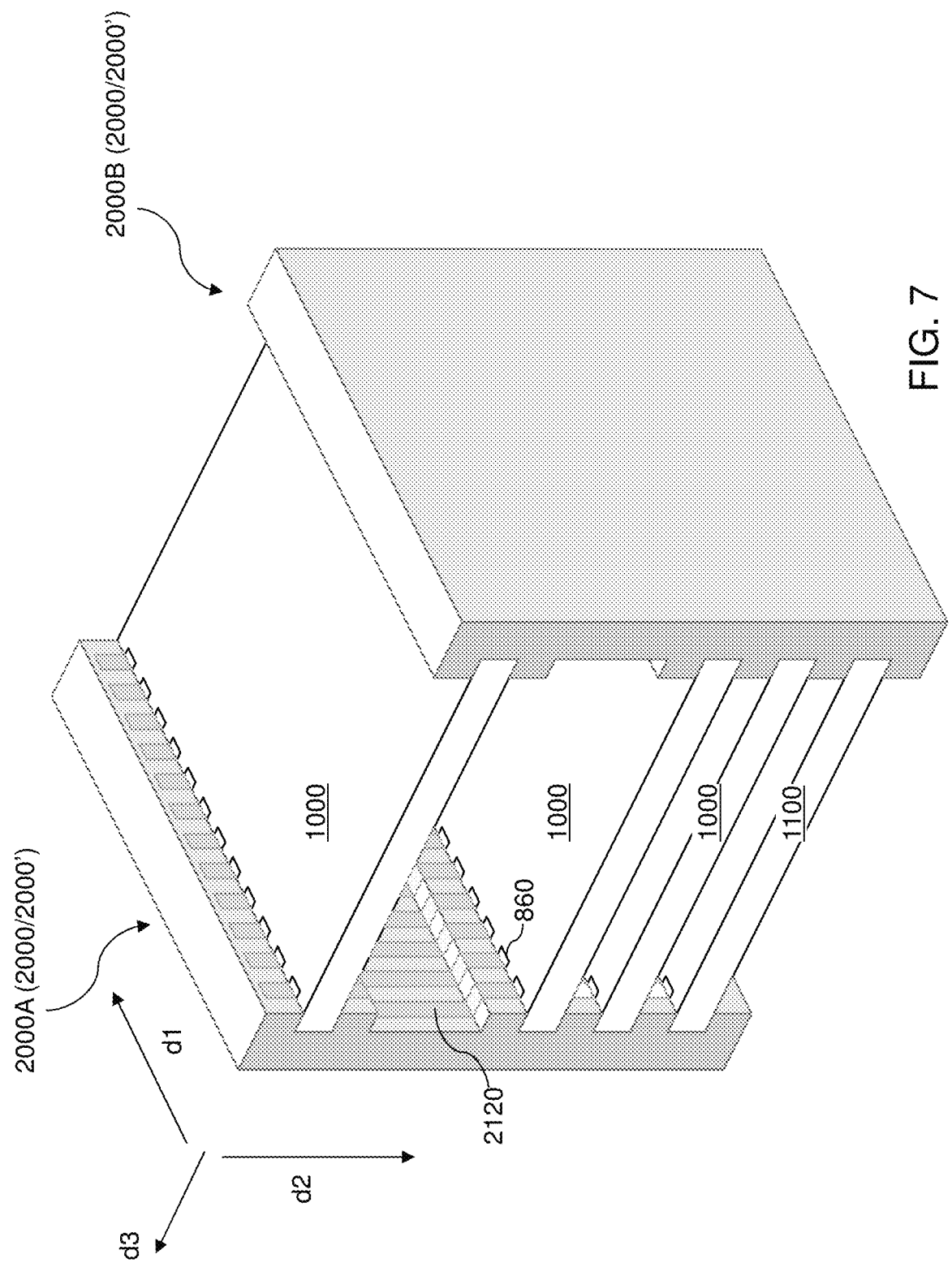
FIG. 7 is a perspective view of a third exemplary chip assembly structure according to an embodiment of the present disclosure.

Referring to FIG. 7, a third exemplary chip assembly structure according to an embodiment of the present disclosure can be derived from the first exemplary chip assembly structure or variations thereof by employing at least one logic chip 1100 as one of the semiconductor chips. The logic chip can include at least one processor unit (such as at least one central processor unit) and/or at least one controller circuitry for operation of the memory devices located in another semiconductor chip 1000 (for example, the logic chip can include field effect transistors (e.g., CMOS devices) which are part of a peripheral (e.g., driver) circuit for controlling operation of the three-dimensional memory devices of the semiconductor device assembly 800 of one or more of the plurality of semiconductor chips 1000). In this case, at least one of the plurality of semiconductor chips (1000, 1100) can include at least one memory chip 1000 including a respective array of memory cells, and at least another of the plurality of semiconductor chips (1000, 1100) can include at least one logic chip 1100 including peripheral semiconductor devices that controls read operations and write operations on the array of memory cells.

Figure 8:
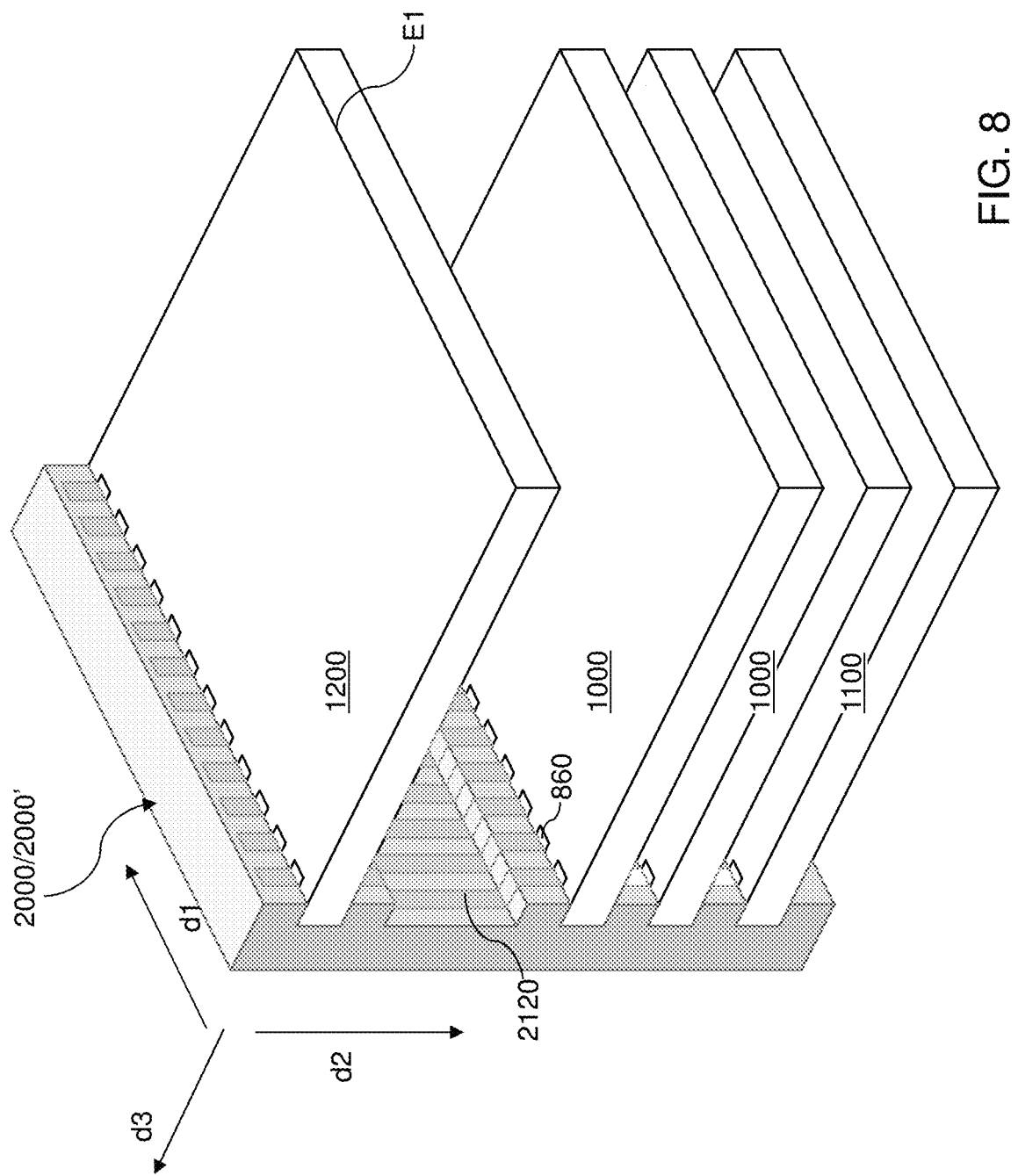
FIG. 8 is a perspective view of a fourth exemplary chip assembly structure according to an embodiment of the present disclosure.

Referring to FIG. 8, a fourth exemplary chip assembly structure according to an embodiment of the present disclosure can be derived from the second exemplary chip assembly structure or variations thereof by employing at least one logic chip 1100 as one of the semiconductor chips. The logic chip can include at least one processor unit (such as at least one central processor unit) and/or at least one controller circuitry for operation of the memory devices located in another semiconductor chip 1000 (for example the process unit can include field effect transistors (e.g., CMOS devices) which are part of a peripheral (e.g., driver) circuit for controlling operation of the three-dimensional memory devices of the semiconductor device assembly 800 of one or more of the plurality of semiconductor chips 1000). In this case, at least one of the plurality of semiconductor chips (1000, 1100) can include at least one memory chip 1000 including a respective array of memory cells, and at least another of the plurality of semiconductor chips (1000, 1100) can include at least one logic chip 1100 including peripheral semiconductor devices that controls read operations and write operations on the array of memory cells.

In another embodiment, an alternative fourth exemplary chip assembly structure according to an alternative embodiment of the present disclosure can be derived from the fourth exemplary chip assembly structure or variations thereof by employing at least one sensor chip 1200 in addition to or instead of the logic chip 1100 as one of the semiconductor chips. The sensor chip 1200 may be an optical or image sensor chip which is located on top of the stack of semiconductor chips. If the optical or image sensor chip 1200 is included as one of the semiconductor chips, then optical signals can be utilized instead of or in addition to electrical signals. If desired, an optional opto-electrical converter chip may be located under the image sensor chip to convert the optical signals to electrical signals.

Figure 9:
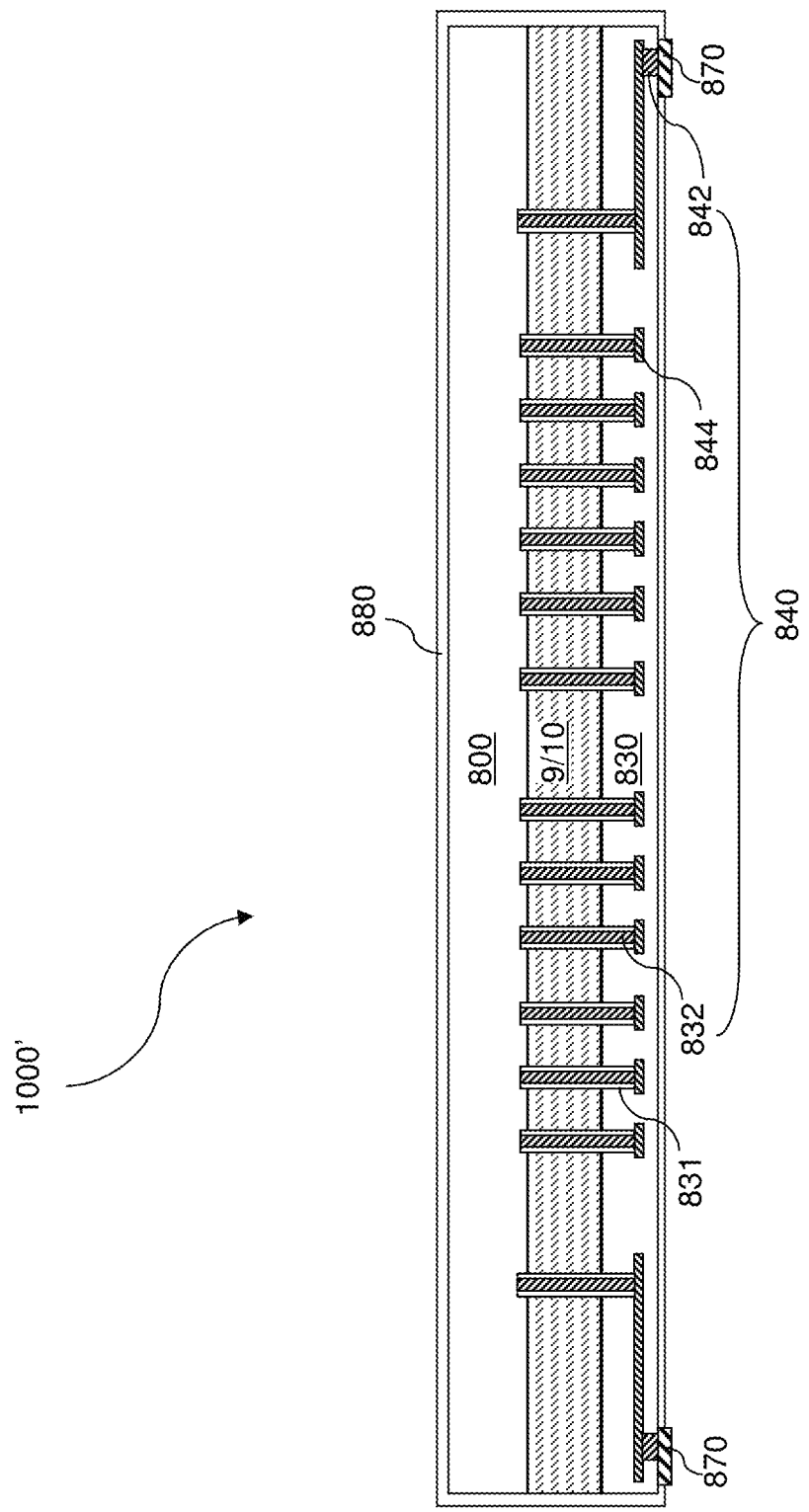
FIG. 9 is a vertical cross-sectional view of a second exemplary semiconductor chip according to an embodiment of the present disclosure.

Referring to FIG. 9, a second exemplary semiconductor chip 1000' according to an embodiment of the present disclosure, which can be employed in lieu of any instances of the first exemplary semiconductor chip 1000 described above. The second exemplary semiconductor chip 1000' can be derived from the first exemplary semiconductor chip 1000 by forming backside Input-output (I/O) level metal interconnect structures 840 embedded in backside input-output (I/O) level dielectric material layers 830 or in the substrate (9, 10) in lieu of forming I/O level metal interconnect structures 820 embedded in input-output (I/O) level dielectric material layers 810 over the top surface of the substrate (9, 10). The I/O level metal interconnect structures 840 is located on the opposite side of the substrate (9, 10) from the semiconductor device assembly 800. The backside I/O level metal interconnect structures 840 include through-substrate via (TSV) structures 832 that extend through the substrate (9, 10) and is electrically connected to a respective metal interconnect structure or a node of a semiconductor device in the semiconductor device assembly 800. The TSV structures 832 can be electrically isolated from the substrate (9, 10) by a respective insulating liner 831. The backside I/O level metal interconnect structures 840 can further include backside I/O level metal via structures 842 and backside I/O level metal line structures 844.

Multiple levels of the backside I/O level metal via structures 842 and multiple levels of the backside I/O level metal line structures 844 may be employed. Backside input-output (I/O) level dielectric material layers 830 embed the backside I/O level metal via structures 842 and the backside I/O level metal line structures 844. The various backside I/O level metal interconnect structures 840 and the various backside I/O level dielectric material layers 830 can be formed level by level. The bottommost layer among the backside I/O level dielectric material layers 830 can include a passivation material layer, which can be a dielectric material that blocks diffusion of contaminants and gases such as hydrogen. For example, a silicon nitride layer can be employed for the bottommost layer among the backside I/O level dielectric material layers 830.

The general configuration of the backside I/O level metal interconnect structures 830 can be selected that the bottommost via structures among the backside I/O level metal via structures 842 are formed as a single row of bottommost via structures extending along a horizontal direction that is parallel to a top surface of the substrate (9, 10), or as two rows of bottommost via structures that extend along a horizontal direction and laterally spaced from each other by a uniform spacing. Each row of bottommost via structures can be formed proximate to the locations of an edge of a semiconductor chip 1000'. Subsequently, each row of bottommost via structures can be contacted by a respective row of conductive pads 870, which are also referred to as bottom conductive pads. The conductive pads 870 can be formed as a single row of conductive pads 870 if the semiconductor chip 1000' includes a single row of bottommost via structures, or can be formed as two rows of conductive pads 870 if the semiconductor chip 1000' includes two rows of bottommost via structures.

The substrate semiconductor layer 9 can be provided as a commercially available semiconductor wafer (e.g., silicon wafer), and multiple dies for semiconductor chips 1000 can be formed on the semiconductor wafer. Typically, 50-5,000 semiconductor dies can be formed on a semiconductor wafer by forming the structures for the optional semiconductor material layer 10, the semiconductor device assembly 800, the backside I/O level metal interconnect structures 840, the backside I/O level dielectric material layers 830, and the conductive pads 870. In one embodiment, each of the multiple dies can have a rectangular shape in a plan view, i.e., in a view along a vertical direction perpendicular to the top surface of the substrate semiconductor layer 9. Upon dicing, each of the multiple dies can become a semiconductor chip 1000'. Each of the semiconductor chips 1000' can have a rectangular shape in a plan view, which can be the same as the rectangular shape of a respective die prior to dicing.

An optional insulating encapsulation matrix 880 can be formed to encapsulate a semiconductor die after dicing. The insulating encapsulation matrix 880, if present, includes an insulating material such as epoxy or a laminated insulating material stack. Suitable polishing or etching processes can be performed to physically expose bottom surfaces of the conductive pads 870 after formation of the insulating encapsulation matrix 880. The insulating encapsulation matrix 880 covers the top surface, the bottom surface, and the sidewalls of a contiguous set of a substrate (9, 10), a semiconductor device assembly 800, I/O level metal interconnect structures 840, and I/O level dielectric material layers 830, and includes openings for the conductive pads 870 so that the bottom surfaces of the conductive pads 870 are physically exposed. The insulating encapsulation matrix 880 electrically isolates, and protects from contaminants or diffusing gases, the various material portions encapsulated therein. The insulating encapsulation matrix 880 and the structures encapsulated therein (including the conductive pads 870) constitute a semiconductor chip 1000'.

Upon insertion into any of the multiple parallel grooves 2111 of the multi-grooved interposers (2000, 2000') described above, the conductive pads 870 physically contact the multiple conductive strips 2120, which provides electrical contact with other conductive pads (860, 870) of other semiconductor chips (1000, 1000') that are inserted into other grooves 2111 of the multi-grooved interposers (2000, 2000'). In this case, at least one of the semiconductor chips (1000, 1000') can be a semiconductor chip 1000' including backside conductive pads 870. In one embodiment, each of the semiconductor chips 1000' attached to a multi-grooved interposer (2000, 2000') can have backside conductive pads 870. In another embodiment, one or more of the semiconductor chips (1000, 1000') attached to a multi-grooved interposer (2000, 2000') can have backside conductive pads 870, and another one or more of the semiconductor chips (1000, 1000') attached to a multi-grooved interposer (2000, 2000') can have conductive pads 860, which are also referred to as front side conductive pads 860.

Figure 10:
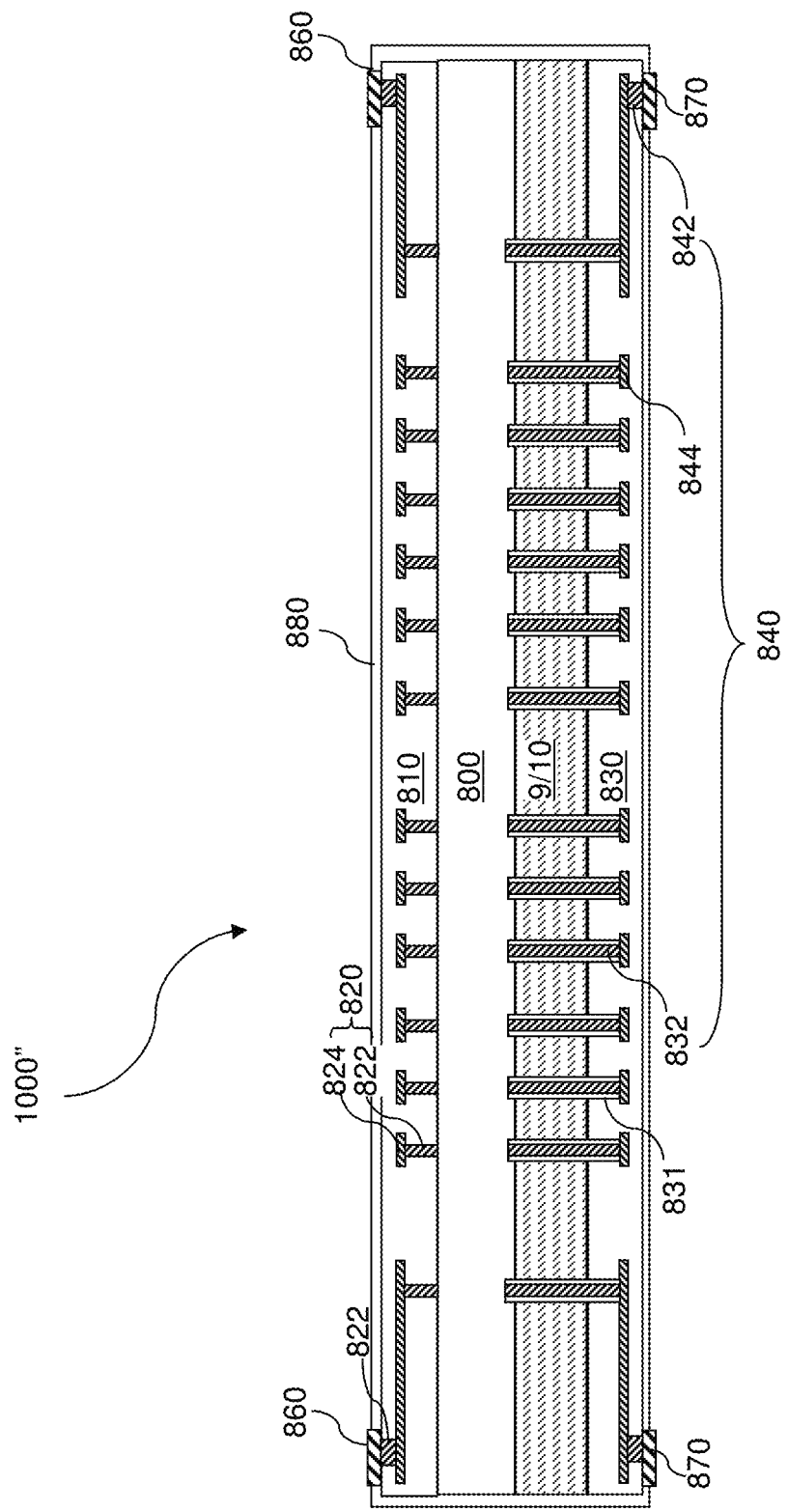
FIG. 10 is a vertical cross-sectional view of a third exemplary semiconductor chip according to an embodiment of the present disclosure.

Referring to FIG. 10, a third exemplary semiconductor chip 1000" according to an embodiment of the present disclosure is illustrated, which can be derived from the first exemplary semiconductor chip 1000 by forming backside Input-output (I/O) level metal interconnect structures 840 embedded in backside input-output (I/O) level dielectric material layers 830 or in the substrate (9, 10) in addition to input-output (I/O) level metal interconnect structures 820 (which are herein referred to as front side I/O level metal interconnect structures 820) embedded in input-output (I/O) level dielectric material layers 810 (which are herein referred to as front side I/O level dielectric material layers 810. The backside conductive pads 870 can be formed in addition to the front side conductive pads 860.

In this case, a semiconductor chip 1000" among a plurality of semiconductor chips (1000, 1000', 1000") attached to a multi-groove interposer (2000, 2000') or a pair of multi-groove interposers (2000, 2000') can include a respective set of conductive pads 860 (i.e., front side conductive pads 860) on a front side surface of thereof, and can include an additional set of conductive pads 870 (i.e., back side conductive pads 870) on a back side surface thereof. Upon insertion into a groove 2111 of a multi-groove interposer (2000, 2000'), the additional set of contact pads 870 contacts the multiple conductive strips 2120.

The backside conductive pads 870 can be employed in addition to the front side conductive pads 860 to provide duplicate contact structures and to enhance electrical contact between the semiconductor chip 1000" and the multiple conductive strips 2120 of one or more multi-grooved interposers (2000, 2000'). In this case, the pitch of the backside conductive pads 870, the pitch of the front side conductive pads 860, and the pitch of the multiple conductive strips 2120 along the first direction d1 can be the same.

Alternatively, the backside conductive pads 870 and the front side conductive pads 860 can have double the pitch of the multiple conductive strips 2120 along the first direction d1. In this case, the backside conductive pads 870 and the front side conductive pads 870 can be laterally offset by half the pitch of the multiple conductive strips 2120 along the first direction d1, and the multiple conductive strips 2120 can alternately contact a front side conductive pad 860 and a backside conductive pad 870 along the first direction d1.

Referring to all drawings and according to various embodiments of the present disclosure, a multi-grooved interposer (2000, 2000') includes an interposer substrate 2100 Containing multiple parallel grooves 2111 laterally extending along a first direction d1 and laterally spaced among one another along a second direction d2, wherein the multiple parallel grooves 2111 are recessed from front side surfaces 2131 of the multi-grooved interposer (2000, 2000') in a third direction d3 toward a back side surface 2151 of the multi-grooved interposer (2000, 2000'). Multiple conductive strips 2120 continuously extend across recessed surfaces in the multiple parallel grooves 2111 and the front side surfaces 2131 along the second direction d2 with an undulating surface profile to provide electrically conductive paths across the multiple parallel grooves 2111. Each of the multiple parallel grooves 2111 is configured to receive an edge of a respective semiconductor chip (1000, 1000', 1000", 1100).

In another embodiment, a chip assembly structure includes the multi-grooved interposer (2000, 2000') and the plurality of semiconductor chips (1000, 1000', 1000", 1100) inserted partially into a respective one of the multiple parallel grooves 2111. Each of the plurality of semiconductor chips (1000, 1000', 1000", 1100) includes a major surface on which a respective set of conductive pads (860, 870) is located, and each of the plurality of semiconductor chips (1000, 1000', 1000", 1100) is in electrical contact with the multiple conductive strips 2120 through physical contact between the respective set of conductive pads (860, 870) and respective portions of the multiple conductive strips 2120.

In one embodiment, a height of the semiconductor chip is substantially the same as (e.g., 0.1 to 5% less than) a width of the groove 2111 along the second direction d2. Generally, the pitch of the set of conductive pads (860, 870) can be integer multiple of the pitch of the multiple conductive strips 2120. In one embodiment, the pitch of the set of conductive pads (860, 870) can the same as the pitch of the multiple conductive strips 2120. In another embodiment, the pitch of the set of conductive pads (860, 870) can double the pitch of the multiple conductive strips 2120. In yet another embodiment, one or more sets of conductive pads (860, 870) of a respective semiconductor chip (1000, 1000', 1000", 1100) may employ only a respective subset of the multiple conductive strips 2120 as electrically conductive paths for interconnection with other semiconductor chips (1000, 1000', 1000", 1100). In such cases, the pitch of the set of conductive pads (860, 870) can triple, quadruple, quintuple, or sextuple of the pitch of the multiple conductive strips 2120. Yet alternately, one or more of the contact pads (860, 870) may be removed from a one-dimensional array of periodic contact pads (860, 870) to provide one or more randomly missing pad locations. In this case, each of the remaining contact pads (860, 870) can be within a row such that each neighboring center-to-center distance of the contact pads (860, 870) is an integer multiple of the pitch of the multiple conductive strips 2120 of the multi-grooved interposer (2000, 2000').

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A chip assembly structure, comprising:
 a multi-grooved interposer comprising an interposer substrate containing multiple parallel grooves laterally extending along a first direction and laterally spaced among one another along a second direction, and multiple conductive strips, wherein the multiple parallel grooves are recessed from front side surfaces of the multi-grooved interposer in a third direction toward a back side surface of the multi-grooved interposer, the multiple conductive strips continuously extend across recessed surfaces in the multiple parallel grooves and the front side surfaces along the second direction with an undulating surface profile to provide electrically conductive paths across the multiple parallel grooves, and each of the multiple parallel grooves is configured to receive an edge of a respective semiconductor chip; and
 a plurality of semiconductor chips inserted partially into a respective one of the multiple parallel grooves,
 wherein:
 each of the plurality of semiconductor chips includes a major surface on which a respective set of conductive pads is located;
 each of the plurality of semiconductor chips is in electrical contact with the multiple conductive strips through direct physical contact between the respective set of conductive pads and respective portions of the multiple conductive strips; and
 each set of conductive pads is located in a row on the major surface of a respective semiconductor chip with an edge offset distance from a first edge of the major surface of the respective semiconductor chip that is inserted into the one of the multiple parallel grooves; and
 further comprising an additional multi-grooved interposer located parallel to the multi-grooved interposer and comprising additional multiple parallel grooves laterally extending along the first direction and laterally spaced among one another along the second direction, wherein the additional multiple parallel grooves are recessed from front side surfaces of the additional multi-grooved interposer in an opposite direction of the third direction toward a back side surface of the additional multi-grooved interposer, wherein additional multiple conductive strips continuously extend across recessed surfaces in the additional multiple parallel grooves and the front side surfaces of the additional multi-grooved interposer along the second direction with an undulating surface profile to provide electrically conductive paths across the additional multiple parallel grooves, wherein each of the plurality of semiconductor chips is inserted partially into a respective one of the additional multiple parallel grooves.

2. The chip assembly structure of claim 1, wherein each of the multiple conductive strips has a respective uniform width in the first direction, and the respective uniform width is invariant along the second direction.

3. The chip assembly structure of claim 1, wherein, for each pair of a groove and a semiconductor chip partly inserted therein, a height of the semiconductor chip is substantially the same as a width of the groove along the second direction.

4. The chip assembly structure of claim 3, wherein:
the multiple conductive strips and each set of conductive pads have a same periodicity along the first direction; and
each set of conductive pads is located in the row with a same offset distance from the first edge of the major surface of the respective semiconductor chip.

5. The chip assembly structure of claim 1, wherein the multi-grooved interposer comprises:
a semiconductor material layer having a major surface that is parallel to the first direction and the second direction;
a plurality of semiconductor devices located on the major surface of the semiconductor material layer; and
an insulating material layer supporting the multiple conductive strips in a surface portion thereof.

6. The chip assembly structure of claim 5, wherein at least two of the plurality of semiconductor chips comprise monolithic three-dimensional NAND memory arrays and wherein the plurality of semiconductor devices comprise field effect transistors which are part of a peripheral circuit for controlling operation of the monolithic three-dimensional NAND memory arrays.

7. The chip assembly structure of claim 1, wherein:
each of the plurality of semiconductor chips is in electrical contact with the additional multiple conductive strips through direct physical contact between a respective additional set of conductive pads and respective portions of the additional multiple conductive strips; and
the multi-grooved interposer and the additional multi-grooved interposer have a same maximum dimension along the first direction, and have another same maximum dimension along the second direction.

8. The chip assembly structure of claim 1, wherein a semiconductor chip among the plurality of semiconductor chips includes a respective set of conductive pads on a front side surface of thereof, and includes an additional set of conductive pads on a back side surface thereof, wherein the additional set of contact pads contacts the multiple conductive strips.

9. The chip assembly structure of claim 1, wherein:
the front side surfaces of the multi-grooved interposer comprise insulating surfaces;
the multiple conductive strips comprise metal strips; and
each set of conductive pads of the plurality of semiconductor chips comprises a set of metal pads.

10. The chip assembly structure of claim 1, wherein:
at least one of the plurality of semiconductor chips comprises a memory chip including an array of memory cells; and
at least another of the plurality of semiconductor chips comprises at least one of a sensor chip or a logic chip including peripheral semiconductor devices that control read operations and write operations of the array of memory cells.

11. The chip assembly structure of claim 1, wherein at least two of the plurality of semiconductor chips comprise monolithic three-dimensional NAND memory arrays which are configured to transmit and receive electrical signals therebetween through the multiple conductive strips.

12. The chip assembly structure of claim 1, wherein each of the plurality of semiconductor chips includes a respective sidewall that extends from a first edge of a major surface of a respective semiconductor chip to a second edge of the major surface of the respective semiconductor chip that is parallel to the first edge, and wherein the respective sidewall is recessed entirely within a respective one of the multiple parallel grooves upon partial insertion of the respective semiconductor chip into the respective one of the multiple parallel grooves.

13. The chip assembly structure of claim 1, wherein each set of the conductive pads does not contact any edges of the major surface of the respective semiconductor chip.

14. The chip assembly structure of claim 13, wherein each set of the conductive pads is offset from a recessed surface of a respective parallel groove of the multiple parallel grooves into which the first edge of the respective semiconductor chip is inserted.

15. The chip assembly structure of claim 14, wherein the major surface comprises a surface having at least 50% of the area of the largest surface of the respective semiconductor chip.

16. The chip assembly structure of claim 1, wherein each of the plurality of semiconductor chips is inserted partially into only the respective one of the multiple parallel grooves of the multi-grooved interposer, and is not inserted into any other of the multiple parallel grooves of the multi-grooved interposer.

* * * * *